United States Patent
Burggraf, III et al.

(10) Patent No.: US 8,694,840 B2
(45) Date of Patent: Apr. 8, 2014

(54) MEMORY TEST ISOLATION LOGIC BANK WITH SEPARATE TEST ENABLE INPUT

(71) Applicant: Texas Instruments Incorporated, Dallas, TX (US)

(72) Inventors: Daniel R. Burggraf, III, Parker, TX (US); Hari Pendurty, Pearland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/963,697

(22) Filed: Aug. 9, 2013

(65) Prior Publication Data

US 2013/0322176 A1 Dec. 5, 2013

Related U.S. Application Data (62) Division of application No. 13/759,667, filed on Feb. 5, 2013, now Pat. No. 8,539,290, which is a division of application No. 12/884,148, filed on Sep. 16, 2010, now Pat. No. 8,392,772.

(51) Int. Cl.
G11C 29/00 (2006.01)

(52) U.S. Cl.
USPC ........................................ 714/718; 714/724

(58) Field of Classification Search
USPC ................................................ 714/718, 724
See application file for complete search history.

(56) References Cited

U.S. PATENT DOCUMENTS

| | | | | |
|---|---|---|---|---|
| 5,127,009 A * | 6/1992 | Swanson | | 714/734 |
| 5,617,531 A * | 4/1997 | Crouch et al. | | 714/30 |
| 6,137,734 A * | 10/2000 | Schoner et al. | | 365/194 |
| 7,428,680 B2 * | 9/2008 | Mukherjee et al. | | 714/733 |
| 7,773,439 B2 * | 8/2010 | Do et al. | | 365/201 |
| 7,979,759 B2 * | 7/2011 | Carnevale et al. | | 714/718 |
| 8,031,552 B2 * | 10/2011 | Chung et al. | | 365/230.05 |
| 8,046,648 B1 * | 10/2011 | Russell | | 714/726 |

* cited by examiner

*Primary Examiner* — Esaw Abraham (74) *Attorney, Agent, or Firm* — Lawrence J. Bassuk; Wade J. Brady, III; Frederick J. Telecky, Jr.

(57) ABSTRACT

An integrated circuit is described that has a substrate with a memory array with dedicated support hardware formed on the substrate. An access wrapper circuit is coupled to address and data lines of the memory array and to control lines of the dedicated support hardware. The wrapper circuit is configured to provide an access port to the memory array. A test controller is formed on the substrate and coupled in parallel with the access wrapper circuit to the address and data lines of the memory array and to the control lines of the dedicated support hardware, wherein the test controller is operable to perform a test of the memory array by manipulating control signals to the support hardware in addition to those required to write data patterns into the memory array and to read the contents of the memory array.

5 Claims, 6 Drawing Sheets

MEMORY TEST ISOLATION LOGIC BANK WITH SEPARATE TEST ENABLE INPUT

This application is a Divisional of prior application Ser. No. 13/759,667, filed Feb. 5, 2013, now U.S. Pat. No. 8,539,290, issued Sep. 17, 2013, which is a Divisional of prior application Ser. No. 12/884,148, filed Sep. 16, 2010, now U.S. Pat. No. 8,392,772, issued Mar. 5, 2013.

FIELD OF THE INVENTION

This invention generally relates to testing of integrated circuits, and in particular to testing of flash memory arrays in an integrated circuit.

BACKGROUND OF THE INVENTION

Flash memory is a non-volatile computer storage technology that can be electrically erased and reprogrammed. It is primarily used in memory cards, USB flash drives, and solid-state drives for general storage and transfer of data between computers and other digital products. It is a specific type of EEPROM (electrically-erasable programmable read-only memory) that is erased and programmed in large blocks. Because erase cycles are slow, the large block sizes used in flash memory erasing give it a significant speed advantage over old-style EEPROM when writing large amounts of data.

Since flash memory is non-volatile, no power is needed to maintain the information stored in the chip. In addition, flash memory offers fast read access times (although not as fast as volatile DRAM memory used for main memory in PCs) and better kinetic shock resistance than hard disks. Another feature of flash memory is that when packaged in a "memory card," it is extremely durable, being able to withstand intense pressure, extremes of temperature, and even immersion in water.

Flash memory costs far less than byte-programmable EEPROM and therefore has become the dominant technology wherever a significant amount of non-volatile, solid state storage is needed. Example applications include PDAs (personal digital assistants), laptop computers, digital audio players, digital cameras and mobile phones. It has also gained popularity in console video game hardware, where it is often used instead of EEPROMs or battery-powered static RAM (SRAM) for game save data.

Flash memory stores information in an array of memory cells made from floating-gate transistors. In traditional single-level cell (SLC) devices, each cell stores only one bit of information. Some newer flash memory, known as multi-level cell (MLC) devices, can store more than one bit per cell by choosing between multiple levels of electrical charge to apply to the floating gates of its cells.

Each flash memory cell resembles a standard MOSFET, except the transistor has two gates instead of one. On top is the control gate (CG), as in other MOS transistors, but below this there is a floating gate (FG) insulated all around by an oxide layer. The FG is interposed between the CG and the MOSFET channel. Because the FG is electrically isolated by its insulating layer, any electrons placed on it are trapped there and, under normal conditions, will not discharge for many years. When the FG holds a charge, it screens (partially cancels) the electric field from the CG, which modifies the threshold voltage (VT) of the cell. During read-out, a voltage intermediate between the possible threshold voltages is applied to the CG, and the MOSFET channel will become conducting or remain insulating, depending on the VT of the cell, which is in turn controlled by charge on the FG. The current flow through the MOSFET channel is sensed and forms a binary code, reproducing the stored data. In a multi-level cell device, which stores more than one bit per cell, the amount of current flow is sensed (rather than simply its presence or absence), in order to determine more precisely the level of charge on the FG.

For high reliability or harsh environment applications, such as automotive uses, current flash micro controller quality and reliability requirements result in relatively large flash test times necessitating higher parallelism in test and low cost per second test platforms as well as efficient use of probe insertions to avoid unnecessary contact with device bond pads. Flash access is limited by device architecture which presents potential gaps where equal access and comparison cannot be made to all portions of the memory. This is due to memory mapping portions of flash to different busses and clock domains to decrease the total address space which must be reserved for Flash.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

To address the quality, portability and test cost associated with embedded flash manufacture, embodiments of the present invention may have a flash memory array in an integrated circuit and include an on-chip test controller that is coupled to provide an address to the flash memory array and to read and write a full row at the provided address. The test controller is operable to perform a test of the memory array by writing data patterns into the memory array and reading the contents of the memory array a full row at a time. The test controller is programmable and may be coupled to a non-volatile memory that holds a test program to be executed by the test controller for testing the memory array. In general, the programmability of the test controller is not dependent on the memory that stores the test program but can be programmed to perform tests from a number of sources if needed.

Several problems and inefficiencies have been identified that impede testing of Flash memories. These problems include the following:

Specialized Flash test methods are not available during application life time to guarantee access or correct latent defects.

Inefficient checking of internally sensed bit state due to bus width of either internal or external comparators. Flash memories typically have large word widths for performance reasons and parallel comparison are impeded by limitations driven by on chip ALU or by test equipment.

No flash test method exists for applying parallel test stimuli. Tests on different components or multiple Flash macros must be performed in series requiring frequent external intervention.

Similar CPU based methodologies require minimum on chip resources from SRAM. In many cases these resources become a bottleneck to efficient flash testing.

Variable system architectures within the same family of products tailored for a particular application or customer make a single, comprehensive, standardized flash test solution difficult.

Flash test methods require specialized equipment or proprietary software that prevents many test procedures from being available in non-manufacturing environments.

Another problem is that verify frequency is limited to interconnect or I/O speed which does not allow exhaustive verification of potential soft defects or guard-banding to application conditions. External test interfaces, while good at detecting static defects cannot exercise the flash macro at speeds which will activate soft defects.

Burn-in test efficiency is hindered due to the requirement of exercising support circuitry and Flash accesses independently. The burn-in methodology is extremely important for the high reliability market as it will tend to degrade weak components allowing detection prior to reaching the end user. Current serial testing of the flash separate from the rest of the system reduces the biased activity in the flash module and reduces the efficiency of a burn-in insertion.

These identified problems and inefficiencies may be overcome by embodiments of an embedded memory test controller that will now be described in more detail.

Figure 1:
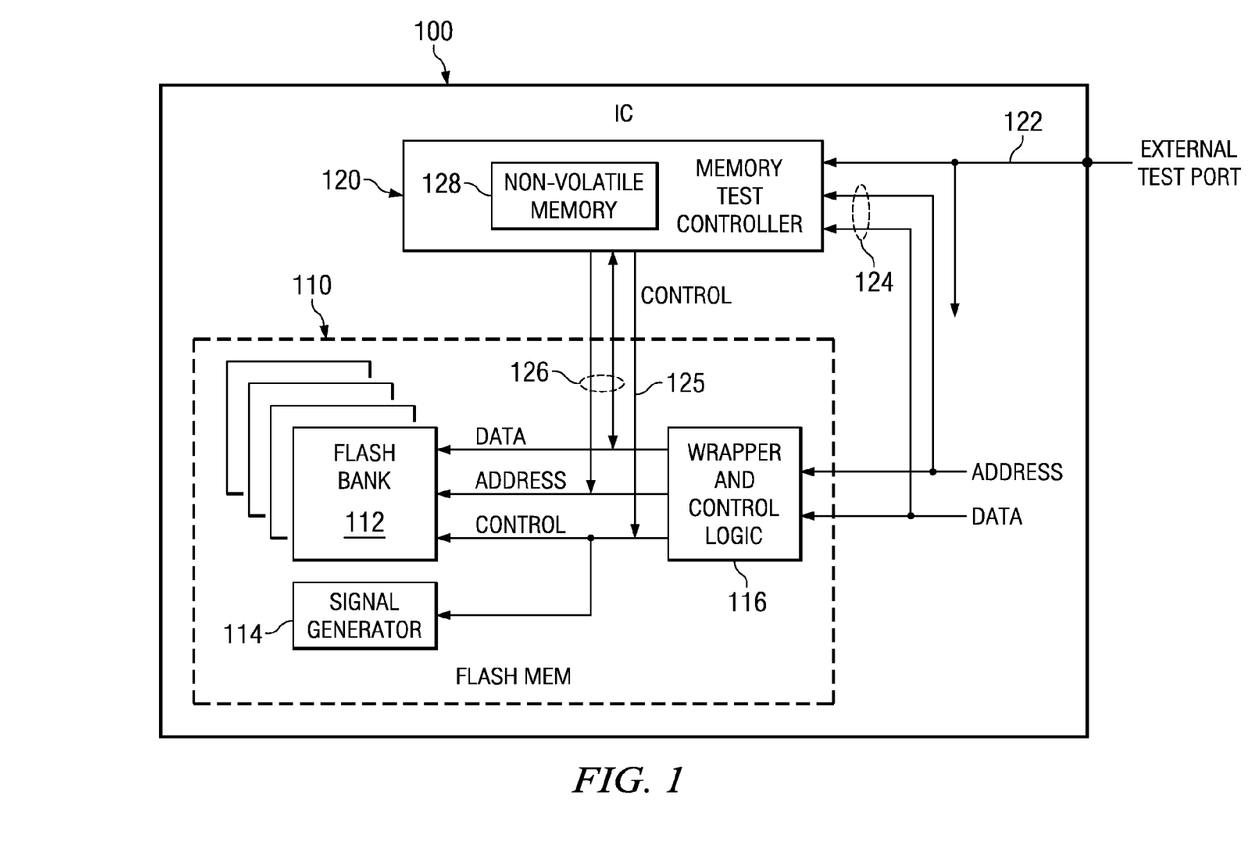
FIG. 1 is a block diagram illustrating an integrated circuit (IC) with a flash memory and an embedded memory test controller.

FIG. 1 is a block diagram illustrating an integrated circuit 100 with a flash memory array 110 and an embedded memory test controller 120. On-chip flash test controller 120 provides a low pin count external port 122, multi-master accessible register interface 124 for Test ROM and CPU based testing, and a tightly coupled interface 125, 126 to the Flash memory and pump.

Flash memory 110 includes one or more banks of memory 112, dedicated support hardware 114, and wrapper and control logic 116. Dedicated support hardware 114 includes a Memory banks 112 are organized as multiple rows of n bits. In various embodiments, the bit length of a row may be longer or shorter; in some embodiments it may be 288 bits or more, for example. Signal generator 114 generates an elevated voltage that is needed to write bits into an accessed row and another voltage to clear a row of bits. Each flash memory cell resembles a standard MOSFET, except the transistor has two gates instead of one. On top is the control gate (CG), as in other MOS transistors, but below this there is a floating gate (FG) insulated all around by an oxide layer. The FG is interposed between the CG and the MOSFET channel which is between the source and drain. Because the FG is electrically isolated by its insulating layer, any electrons placed on it are trapped there and, under normal conditions, will not discharge for many years. To program a bit, an elevated voltage, such as 12 volts, is applied to the control gate which turns on the channel. The resulting channel current causes some high energy electrons jump through the insulating layer onto the floating gate via hot-electron injection. To erase the cell, an opposite elevated voltage, such as −12 volts, is applied between the control gate and the source terminal of the MOSFET. This draws electrons off the floating gate through quantum tunneling.

In general, flash memory arrays are divided into erase segments (often called blocks or sectors). The erase operation can only be performed on a block-wise basis; all the cells in an erase segment must be erased together. Programming of cells, however, can generally be performed one byte or word at a time.

Memory test controller 120 is programmable and may be coupled to non-volatile memory 128 that holds instruction sequences that are executed by test controller 120. Memory 128 is a self-tested high density read only memory (ROM) which eliminates the need for code uploads and system memory requirements of other CPU based test methods. Memory 128 may itself be a flash memory, a conventional read only memory (ROM), or other form of non-volatile memory. It may be one bank of flash memory 110, for example. In this case, the testing process may not cover the portion of memory 110 that holds the test sequences, or it may copy itself to another location during testing. The memory test controller uses hardware and instructions designed for typical memory test operations and so reduces the number and size of instructions.

The test controller provides a tightly coupled interface 125 to the flash macros allowing them to be tested at specified frequency regardless of Interconnect structure. This allows a greater degree of speed margining and guard band for macro characterization and outlier detection. Wrapper and control logic 116 control the operation of memory banks 112 and divide the wide native words received from the memory banks into small width words that are provided to other modules on IC 100 or to off-chip modules or controllers. A wide interface 126 allows on-chip test controller 120 to perform comparisons on the native word width of the flash memory ensuring that every bit is sensed under the same conditions during test and in the application.

Logic isolation techniques allow the use of the memory test controller, Flash module and support circuitry during Automated Test Pattern Generation (ATPG) based testing via test port 122. This allows concurrent exercising of flash and remaining digital circuits for better stress efficiency during manufacturing based stress tests like Burn-in. ISO_TEST (363) signal can be used to enable the proper test paths independent of other test enables which could be generated via secure logic, or MPU that does not require the device to be in ATPG mode.

The self test capability is available during the application lifetime of IC 100 to provide continued programmable margin testing in order to guarantee specification compliance and to detect potential t(0)+n related reliability issues. For example, an application running on IC 100 may periodically initiate a memory test of flash memory 110 by sending commands to test controller 120 via register access port 124.

Figure 2:
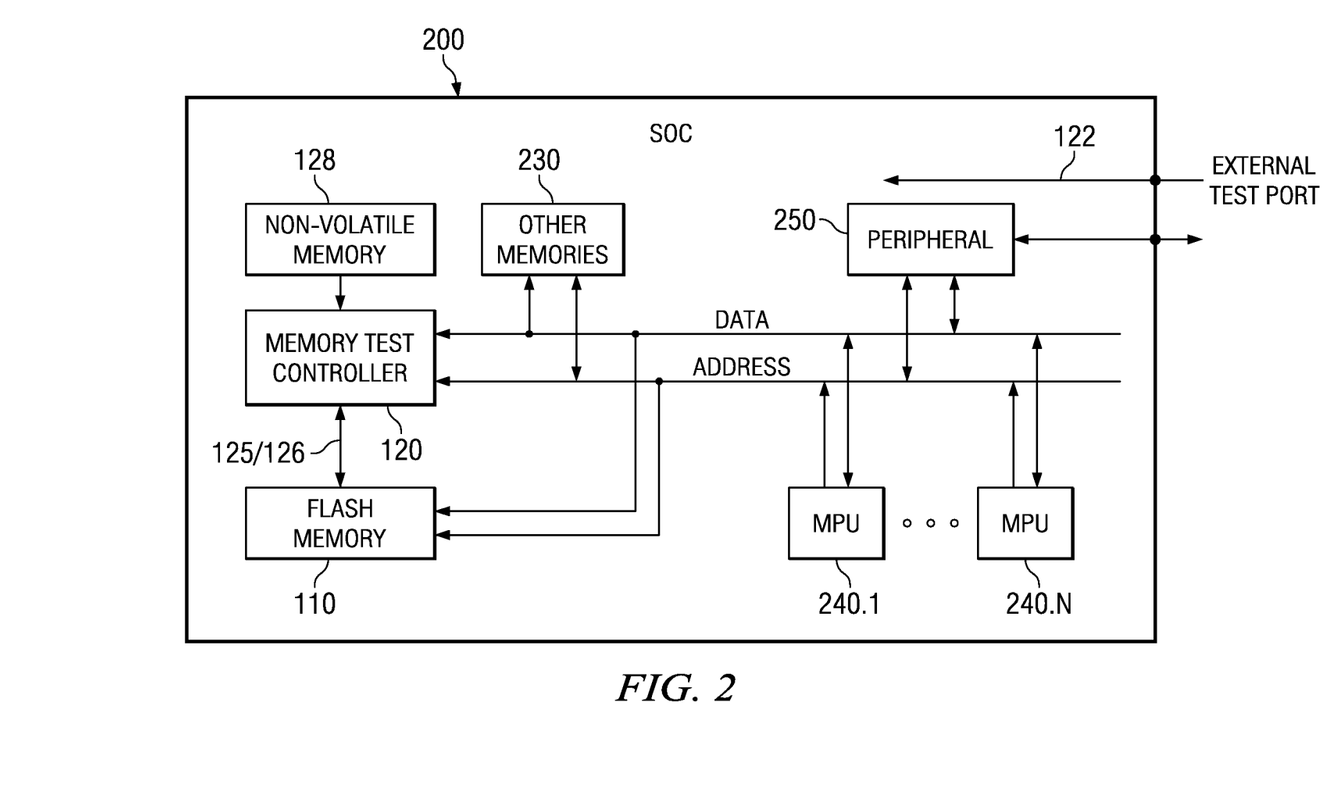
FIG. 2 is a block diagram illustrating a system on a chip that includes an on-chip memory test controller.

FIG. 2 is a block diagram illustrating a system on a chip (SOC) 200 that includes an on-chip memory test controller 120 for testing on-chip flash memory 110. SOC 200 may include one or more microprocessor units (MPU) 240.1-240.n, and one or more peripheral units 250. Each MPU 240 may be any type of currently known or later developed processor core and each may include a central processing unit (CPU), cache(s), local memory, etc. Each peripheral 250 may a dedicated unit for various types of data input/output activities, data processing tasks or data movement tasks, for example. The function and operation of MPU(s) 240 and peripheral(s) 250 depends on the application for which SOC 200 is intended.

Embedded test controller 120 allows testing multiple banks of memory in parallel. This may be done using CPU 240 to perform test operations on memory 230 which do not require comparisons of output states or accessing other test modes, while memory test hardware 120 uses private bus 125/126 and control isolation to test flash memory 110.

Because the memory test solution described above is independent of the variability in system architecture and processor type, and external test equipment, it facilitates a shorter development time and therefore expedites the overall device qualification and test cycle. Since this is a test platform independent test solution, complete testing of an embedded memory can be assured without the need to develop a new test process for each new SOC. This also facilitates increased system throughput and minimal program memory usage for application based self test of the flash memory.

Memory test controller 120 may be embodied as a macro cell in a design library. To increase the number of bits that are compared in parallel, the bus width of bus 126 and the compare logic within test controller 120 is implemented as a parameter that can accommodate up to 288 bits. This removes much of the overhead during testing that is required in dividing a memory module's output into lanes that can be sent to the on-chip central processor (CPU) or off chip resources.

Several features combine to allow this hardware instantiation to be fixed in size regardless of the macro under test. The memory test controller uses hardware and instructions designed for typical memory test operations and so reduces the number and size of instructions. The algorithms are stored in a self-tested high density read only memory (RAM) which eliminates the need for code uploads and system memory requirements of other CPU based test methods. The memory test controller facilitates increased system throughput and minimal program memory usage for application based self test of the Flash.

Because the memory test solution is independent of the variability in system architecture and processor type, and external test equipment it facilitates a shorter development time hence expediting the overall device qualification and test cycle.

Figure 3:
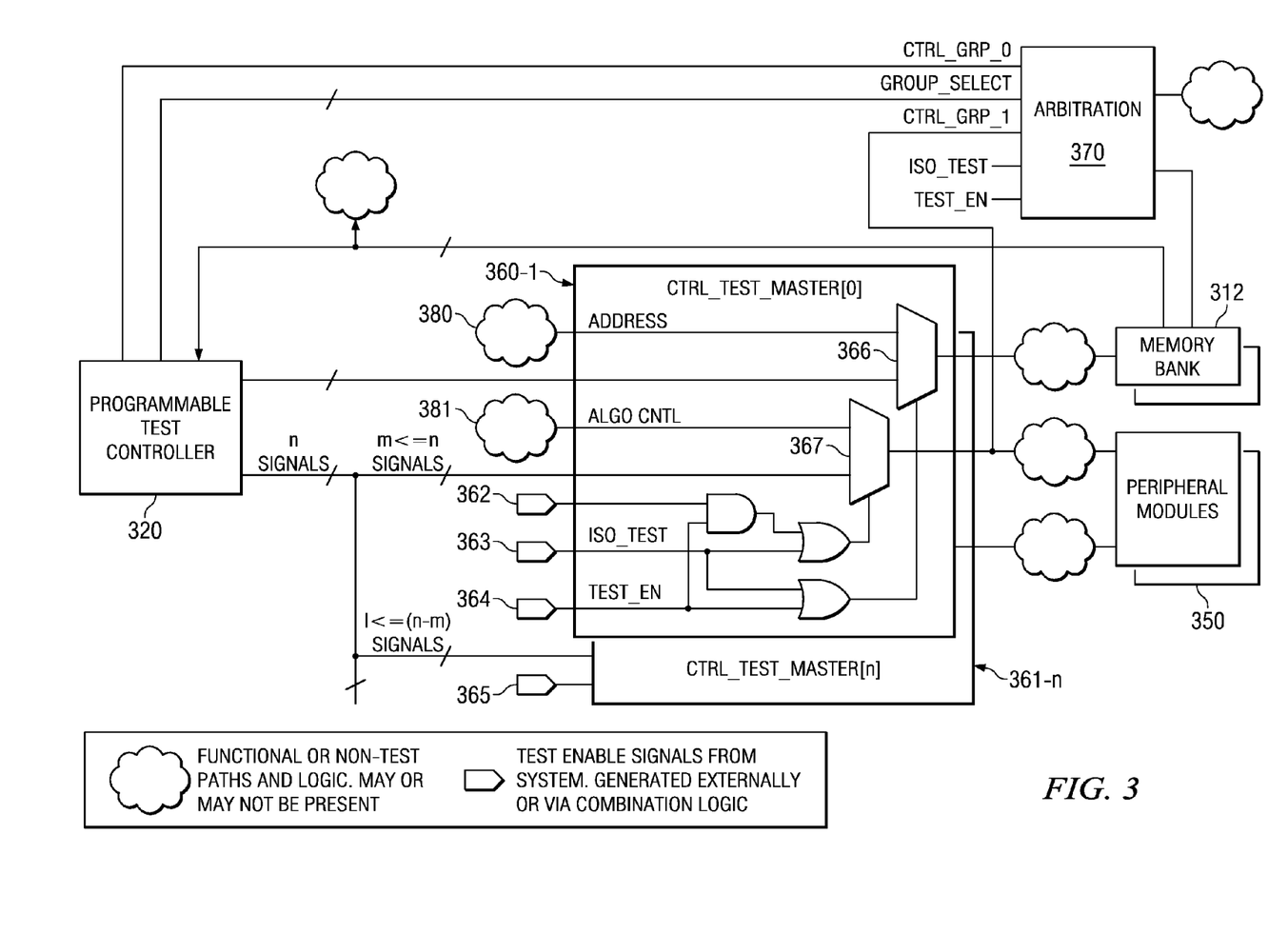
FIG. 3 is a block diagram of another embodiment of an IC illustrating an on-chip tester with isolation logic

FIG. 3 is a block diagram of another embodiment of an IC illustrating an on-chip tester 320 with isolation logic 360-1, 361-n that allows on-chip tester 320 to test one bank of memory 312 while another on-chip or off-chip resource may access another bank of memory 312 or a peripheral module 350. On-chip tester is the same or similar to on-chip tester 120, described earlier. In various embodiments, there may be more than two copies of the isolation logic 360, each associated with a memory bank or peripheral module. For a flash memory, one or more of the peripheral modules 350 may be dedicated support logic that provides a voltage pump and other control logic for the flash memory. Arbitration logic 370 controls access to each memory bank.

For example, when testing is enabled via logic 364 and on-chip tester 320 is designated to be a test master, as indicated by logic 362, then multiplexors 366 in isolation logic 360-1 are selected to allow control signals from test controller 320 to control the memory bank to perform clear, write and read operations. Similarly, multiplexors 367 are selected to allow control signals from test controller 320 to control the memory support logic 350 to perform clear, write and read operations on the memory. Otherwise, multiplexors 366, 367 are selected to allow access by another on-chip or off-chip resource represented generally at 380, 381.

Each set of isolation logic 360-1, 361-n, is coupled to a particular memory bank or peripheral module resource and each may be controlled individually to allow a different on-chip or off-chip controller access to the associated resource.

In another test mode, an isolated test may be performed when the chip is not performing normal functional operation. In this mode, indicated by logic 363, scan testing or other types of invasive testing may be performed. ISO_TEST (363) signal can be used to enable the proper test paths independent of other test enables which could be generated via secure logic, or MPU that does not require the device to be in ATPG mode.

During the lifetime of the SOC, occasional or periodic testing may be performed to assure the memory is operating correctly. Test controller 320 is controlled by a CPU on the SOC or some external stimulus device to kick off the test. The CPU or other stimulus device may decide that it is time to perform a periodic maintenance test and determine that the test would not interfere with operation of the SOC. The CPU or other stimulus device would then configure the test controller using the TEST_EN signal 364. This type of lifetime self test capability is available in embodiments of the invention because whatever is using the Flash can still maintain an application flow while the test is going on, provided there is two banks.

Figure 4:
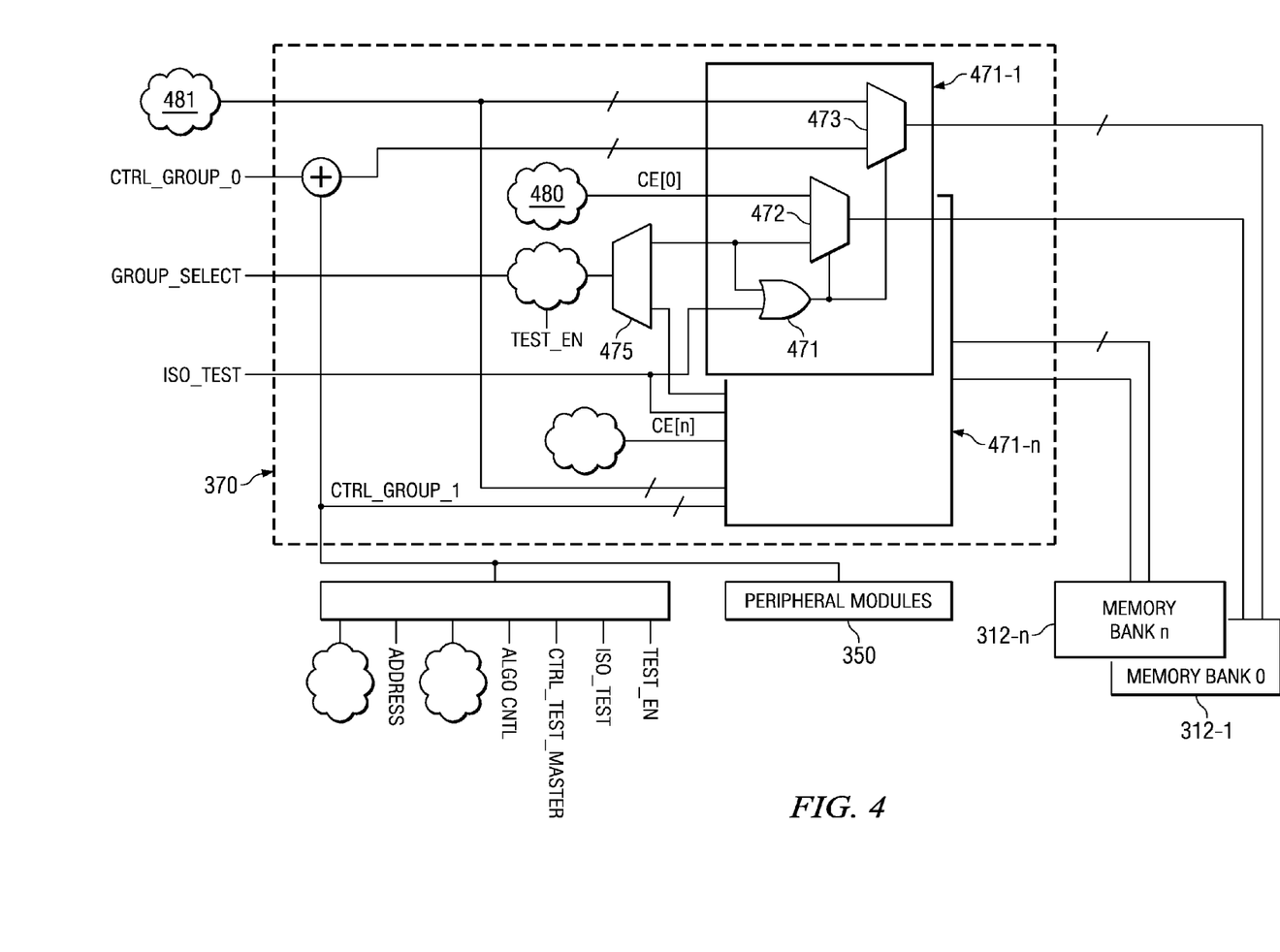
FIG. 4 is a more detailed diagram of the isolation logic of FIG. 3.

FIG. 4 is a more detailed diagram of arbitration logic 370 of FIG. 3. There may be multiple sets of arbitration logic 471-1, 471-n, each associated with one bank 312-1, 312-n of the memory 312. Decoder 475 selects and enables a particular one of arbitration logic 471 during testing by on-chip controller 320. For example, when arbitration logic 471-1 is selected for testing, then multiplexors 472, 473 select chip enables and control signals from on-chip test 320. Otherwise, multiplexors 472, 473 select chip enables and control signals from another on-chip or off-chip controller, represented by modules 480, 481. In this manner, on-chip tester 320 may access memory bank 312-1 while another on-chip or off-chip controller access other memory banks 312-n.

Figure 5:
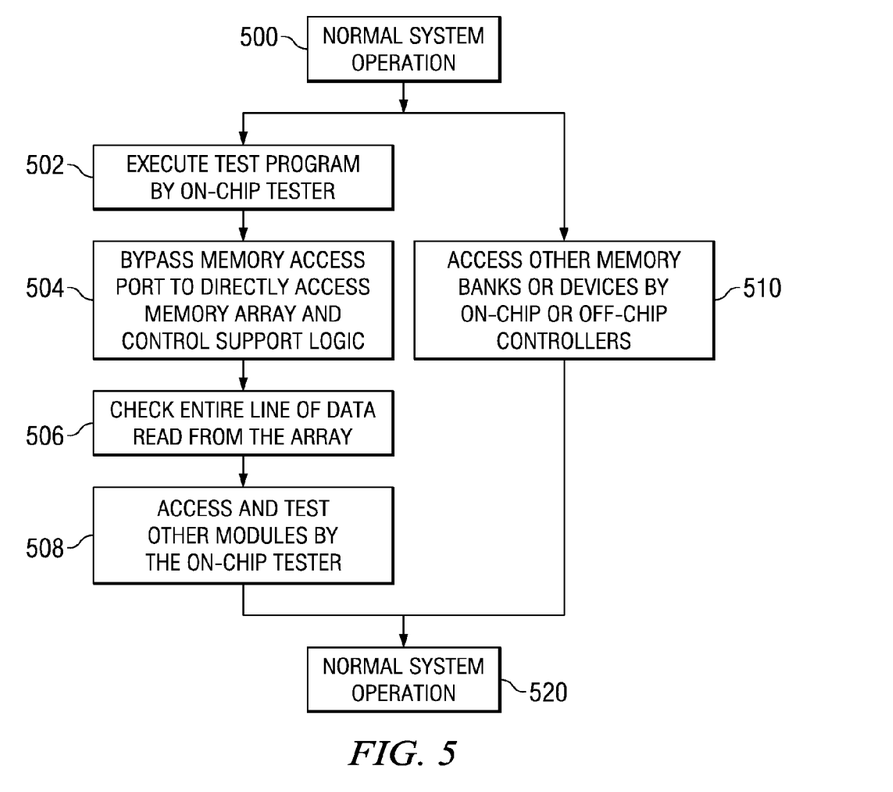
FIG. 5 is a flow chart illustrating testing of a memory array with an on-chip memory tester.

FIG. 5 is a flow chart illustrating testing of a memory array with an on-chip memory tester. A system on a chip may be performing 500 normal system functions. At some point, a decision is made to perform testing. This may be controlled by a processor on the SOC that periodically instantiates testing, or it may be initiated by a tester in a factory testing environment, by a request received from a test port, etc. A test program is executed 502 from a non-volatile memory located on the substrate by a test controller located on the substrate. The test controller is interconnected with the memory array as described in more detail above and includes non-volatile memory that holds the test program.

The memory array has an access wrapper that provides an access port to various on-chip or off-chip controllers that are connected to access the memory. During testing, the access port is bypassed 504 to allow the on-chip test controller to directly access the memory array and associated dedicated support hardware to write data into the memory array and to read data from the memory array. The test controller checks an entire line of data read from the memory array by comparing 506 the data read from the memory to data written into the memory to determine erroneous operation of the memory array.

Accessing the dedicated support hardware 504 allows directly controlling operation of a voltage pump by the test controller while accessing the memory array.

The memory array bank being tested is isolated from one or more other access devices while the test controller is accessing the memory array, which allows the one or more other access devices to access 510 another module while the test controller is executing the test program. This may be another bank in the memory, or a peripheral module or other logic module on the SOC. In this manner, normal operation may continue while a memory bank is being tested by the on-chip controller. Alternatively, testing time may be reduced by testing performed by another on-chip or off-chip controller being performed 510 in parallel with testing being performed 504, 506 by the on-chip test controller.

One or more additional functional modules may be accessed 508 by the test controller to perform tests on the one or more additional functional modules.

Figure 6:
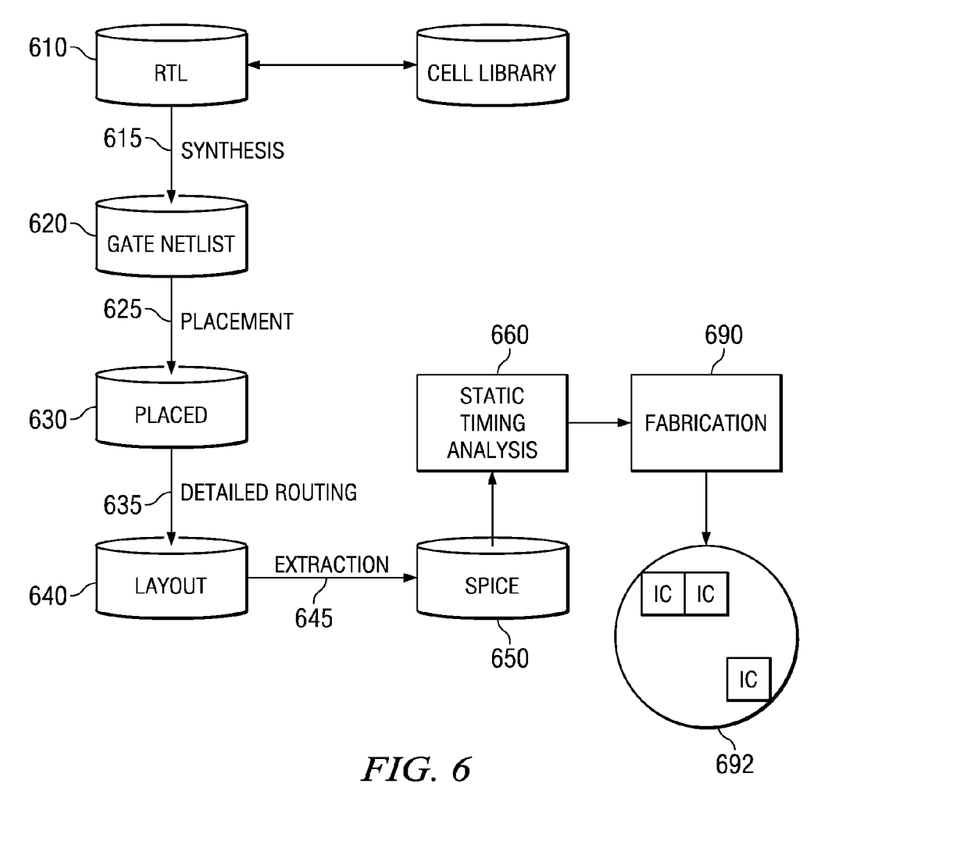
FIG. 6 is a block diagram of a design system for designing an IC in accordance with an embodiment of the present invention.

FIG. 6 is a block diagram of a design system for designing a SOC in accordance with an embodiment of the present invention. An embodiment of the invention may be encapsulated in a programmable memory tester library macro cell. The macro may be a set of high level language instructions configured to be stored in a computer aided design library, for example, cell library 680, that when instantiated forms a test controller. The test controller may be coupled in parallel with an access wrapper circuit to address and data lines of a memory array and to control lines of dedicated support hardware for the memory array, as described in more detail above. The test controller is operable to perform a test of the memory array by manipulating control signals to the support hardware in addition to those required to write data patterns into the memory array and to read the contents of the memory array, as described above. The test controller macro may be configured to receive a parameter to define a width of a data bus and comparators for comparing data read from the memory, wherein the parameter allows a data bus and comparator width that is larger than an access port provided by the access wrapper circuit of the memory. In one embodiment, the parameter allows specification of up to 288 bits of data bus and comparators.

The specification of a circuit exists at multiple levels. Register transfer level (RTL) model 610 is the specification of a circuit design at the register transfer level. It can be written by hand, or can be generated by other design tools. A cell is an abstract representation of a component in a design. Cell library 680 contains a set of cells that define various functional blocks that can be instantiated multiple times to form an RTL circuit design. Cell library 680 is a collection of descriptors of the physical layouts of the component or multiple components that form a respective electrical device or devices, where each layout is referred to as a cell or standard cell. Thus, for each component, such as one more individual circuit elements, logical functions, or storage elements, one or more cells are included in cell library 680 to designate a corresponding one or more physical layout of the layers used in integrated circuit construction to implement the component. The RTL specification defines how the instantiated functional blocks are interconnected to produce the complete circuit design for the SOC.

A synthesis tool 615 is a program that is used to convert the RTL specification of a circuit into a gate netlist 620. Netlist 620 represents a description of devices as defined by their nodes and the functionality of each device as between their nodes, where such devices may include any circuit element including transistors, resistors, capacitors, and so forth. Netlist 620 includes the connections between these devices as well as their terminals, or "ports," to the external environment.

Another program, the placement tool 625, is used to convert a gate netlist representation of a circuit design into placed gates 630. Finally a detailed routing program 635 is used to generate an exact layout 640 of the circuit design. Typically, an electronic design automation (EDA) tool performs both placement and routing. Placement in this context refers to the assignment of a location for each component in netlist 620, as guided by certain rules that accompany the placement determination. In other words, placement program 625, when executed by a processing system, defines a two-dimensional area that corresponds to the area the SOC to be constructed, and then determines the location within that area for each component in netlist 620 so that the determined placement is according to, and does not violate, the accompanying placement rules.

After a layout has been generated, timing analysis consists of running an extraction program 645 to extract a Spice 650 representation of the design. Then, static timing analysis tool 660 is used to generate timing results for the circuit. One or more steps in the standard flow may be combined into a single software package. One example of a static timing analysis tool is the tool sold by Synopsys, Inc, under the trademark PrimeTime. Once timing results are produced, hand-optimization is used to change circuit specifications at the RTL level. Optimizations at other levels may be difficult and time consuming to incorporate.

Once all simulation and testing is completed, images are formed on respective reticules so that each circuit layer may be formed on a wafer using known semiconductor fabrication processing 690, to form a wafer 692 that is separated into multiple die (IC) that each correspond to the SOC. Each die is then packaged and tested.

The general operation of design process of FIG. 6 is well known in the art and also should be understood with reference to the descriptions above. The EDA system may be any suitable collection of software tools that provides computer-aided design of ICs. Suitable EDA systems are available from, for example, Magma Design Automation, Inc. (Santa Clara, Calif.), Cadence Design Systems, Inc. (San Jose, Calif.), and Mentor Graphics (Wilsonville, Ore.).

OTHER EMBODIMENTS

Although the invention finds particular application to an Application Specific Integrated Circuit (ASIC), it also finds application to other forms of system on a chip (SOC) or various types of memory chips. An ASIC or SOC may contain one or more megacells which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, while testing of flash memory was described herein, embodiments of the invention may be used on other types of memory now known or later developed. Embodiments of the invention may be implemented to test other peripheral devices or modules located on an SOC in addition to memory arrays.

A signal generator is described herein for a flash memory that generates elevated voltage for writing and clearing. In other embodiments, a signal generator associated with another type of memory may be a voltage pump, a regulator, or other signaling module required by the memory. A signal generator may also produce timing manipulation of normal voltage signals used by other non-volatile memories.

In some embodiments, the ASIC may be mounted on a printed circuit board. In other embodiments, the ASIC may be mounted directly to a substrate that carries other integrated circuits.

For harsh environments, such as automotive applications, the SOC is designed with sufficient tolerance and manufactured in such a manner that the SOC can operate correctly over a temperature range and shock and vibration range required for automotive applications. For such applications, the on-chip peripheral devices may provide control signals for drive-train control, for example. The peripheral devices included within the SOC are controlled by one or more processors that execute programs contained in a flash memory that is tested as described herein. Testing of the SOC may be performed over the lifetime of the SOC using an on-chip test controller as described herein.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An integrated circuit, comprising:
   A. a memory array arranged in separate memory array banks, each bank having separate bank data, bank address, and bank control leads;
   B. wrapper and control circuitry having memory leads for the bank data, bank address, and bank control leads of each bank of the memory array and having interface address and data leads;
   C. test controller circuitry having test leads for the bank data, bank address, and bank control leads of each bank of the memory array; and
   D. isolation logic arranged in separate banks, one isolation logic bank for each memory array bank, each isolation logic bank having memory leads connected to the memory leads of the wrapper and control circuitry, having test leads connected to the test leads of the test controller circuitry, and having bank leads connected only to the bank address and bank control leads of one memory array bank, each isolation logic bank including gating and multiplexer circuits and having a separate test enable input lead.

2. The integrated circuit of claim 1 in which the memory array is an array of non-volatile memory.

3. The integrated circuit of claim 1 in which the test controller circuitry includes a non-volatile memory containing a test program to be executed by the test controller for testing the memory array.

4. The integrated circuit of claim 1 in which the test controller circuitry includes an external test port.

5. The integrated circuit of claim 1 in which the test controller circuitry includes interface address and data leads connected to the interface address and data leads of the wrapper and control circuitry.

* * * * *